US009214422B2

United States Patent
Fujii

(10) Patent No.: US 9,214,422 B2
(45) Date of Patent: Dec. 15, 2015

(54) SEMICONDUCTOR APPARATUS HAVING SIGNAL AND GROUND TERMINALS ARRANGED ON VERTICALLY ADJACENT WIRING SUBSTRATES

(71) Applicant: SHINKO ELECTRIC INDUSTRIES CO., LTD., Nagano (JP)

(72) Inventor: Tomoharu Fujii, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/169,191

(22) Filed: Jan. 31, 2014

(65) Prior Publication Data

US 2014/0239492 A1 Aug. 28, 2014

(30) Foreign Application Priority Data

Feb. 25, 2013 (JP) ................................ 2013-034718

(51) Int. Cl.
*H01L 23/498* (2006.01)

(52) U.S. Cl.
CPC .... *H01L 23/49811* (2013.01); *H01L 23/49827* (2013.01); *H01L 23/49833* (2013.01); *H01L 2224/16225* (2013.01); *H01L 2924/15311* (2013.01)

(58) Field of Classification Search
CPC .................. H01L 23/49811; H01L 23/49833; H01L 23/59827
See application file for complete search history.

(56) References Cited

U.S. PATENT DOCUMENTS

| | | | | |
|---|---|---|---|---|
| 5,293,145 A * | 3/1994 | Rynkiewicz | ................... | 336/65 |
| 5,926,951 A * | 7/1999 | Khandros et al. | ............... | 29/843 |
| 6,608,379 B2 * | 8/2003 | Yeo et al. | ........................ | 257/706 |
| 6,625,881 B2 * | 9/2003 | Ammar et al. | .................. | 29/830 |
| 7,225,538 B2 * | 6/2007 | Eldridge et al. | ................. | 29/879 |
| 7,456,046 B2 * | 11/2008 | Buchwalter et al. | ........... | 438/107 |
| 8,004,093 B2 * | 8/2011 | Oh et al. | ........................ | 257/783 |
| 8,686,552 B1 * | 4/2014 | Chow et al. | ................... | 257/686 |
| 9,040,830 B2 * | 5/2015 | Kobayashi | ......... | H01R 13/2442 174/250 |
| 2010/0165562 A1 * | 7/2010 | Segaram | ................... | 361/679.31 |

FOREIGN PATENT DOCUMENTS

JP 11-008474 1/1999

* cited by examiner

*Primary Examiner* — William Coleman
(74) *Attorney, Agent, or Firm* — IPUSA, PLLC

(57) ABSTRACT

A semiconductor apparatus includes a first wiring substrate, a second wiring substrate positioned above the first wiring substrate, multiple connection terminals provided between the first wiring substrate and the second wiring substrate and configured to electrically connect the first wiring substrate and the second wiring substrate, an electronic component provided on at least one of the first wiring substrate and the second wiring substrate. The multiple connection terminals include a signal terminal and ground terminals provided on both sides of the signal terminal. The signal terminal and the ground terminals have side surfaces that face each other. The signal terminal and the ground terminals are adjacently arranged, so that intervals between the side surfaces of the signal terminal and the ground terminals are constant from a plan view.

10 Claims, 11 Drawing Sheets

SEMICONDUCTOR APPARATUS HAVING SIGNAL AND GROUND TERMINALS ARRANGED ON VERTICALLY ADJACENT WIRING SUBSTRATES

CROSS-REFERENCE TO RELATED APPLICATIONS

This application is based upon and claims the benefit of priority of the prior Japanese Patent Application No. 2013-034718 filed on Feb. 25, 2013, the entire contents of which are incorporated herein by reference.

FIELD

The embodiments discussed herein are related to a semiconductor apparatus.

BACKGROUND

Conventionally, there is known a semiconductor apparatus having wiring substrates layered on top of each other by way of connection terminals (e.g., solder balls) and including one or more electronic components (e.g., semiconductor chips) mounted on the wiring substrates. For example, the semiconductor apparatus may be obtained by manufacturing multiple wiring substrates that include a semiconductor chip flip-chip bonded to a front surface of the wiring substrate and an electrode pad provided on the front and back surfaces of the wiring substrate, and using solder balls to bond the electrode pads provided on vertically adjacent wiring substrates (see, for example, Japanese Laid-Open Patent Publication No. 11-8474).

However, because the above-described semiconductor apparatus uses connection terminals such as solder balls having substantially spherical shapes, a mismatch of impedance occurs at apart of the connection terminals in a case of attempting to transmit high frequency signals between the vertically adjacent wiring substrates by way of the connection terminals. Therefore, it is difficult for the semiconductor apparatus to transmit high frequency signals by way of connection terminals.

SUMMARY

According to an aspect of the invention, there is provided a semiconductor apparatus that includes a first wiring substrate, a second wiring substrate positioned above the first wiring substrate, multiple connection terminals provided between the first wiring substrate and the second wiring substrate and configured to electrically connect the first wiring substrate and the second wiring substrate, an electronic component provided on at least one of the first wiring substrate and the second wiring substrate. The multiple connection terminals include a signal terminal and ground terminals provided on both sides of the signal terminal. The signal terminal and the ground terminals have side surfaces that face each other. The signal terminal and the ground terminals are adjacently arranged, so that intervals between the side surfaces of the signal terminal and the ground terminals are constant from a plan view.

The object and advantages of the invention will be realized and attained by means of the elements and combinations particularly pointed out in the claims.

It is to be understood that both the foregoing general description and the following detailed description are exemplary and explanatory and are not restrictive of the invention as claimed.

DESCRIPTION OF EMBODIMENTS

Figure 1A:
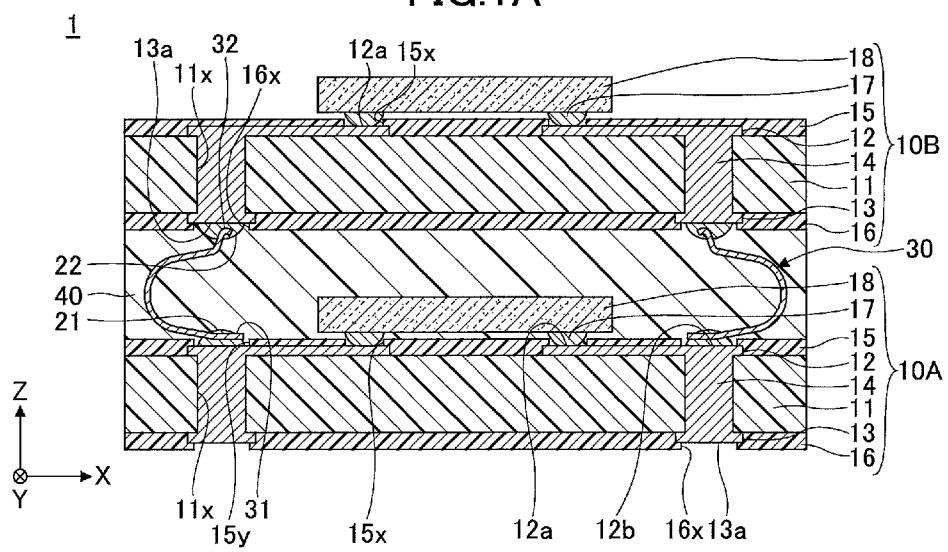
FIGS. 1A and 1B illustrate an example of a semiconductor apparatus according to a first embodiment of the present invention.

Next, embodiments of the present invention are described with reference to the accompanying drawings. Throughout the drawings, like components/parts are denoted with like reference numerals. Thus, detailed descriptions of like components/parts denoted with like reference numerals are omitted.

<First Embodiment>
<Structure of Semiconductor Apparatus of First Embodiment>

Figure 1B:
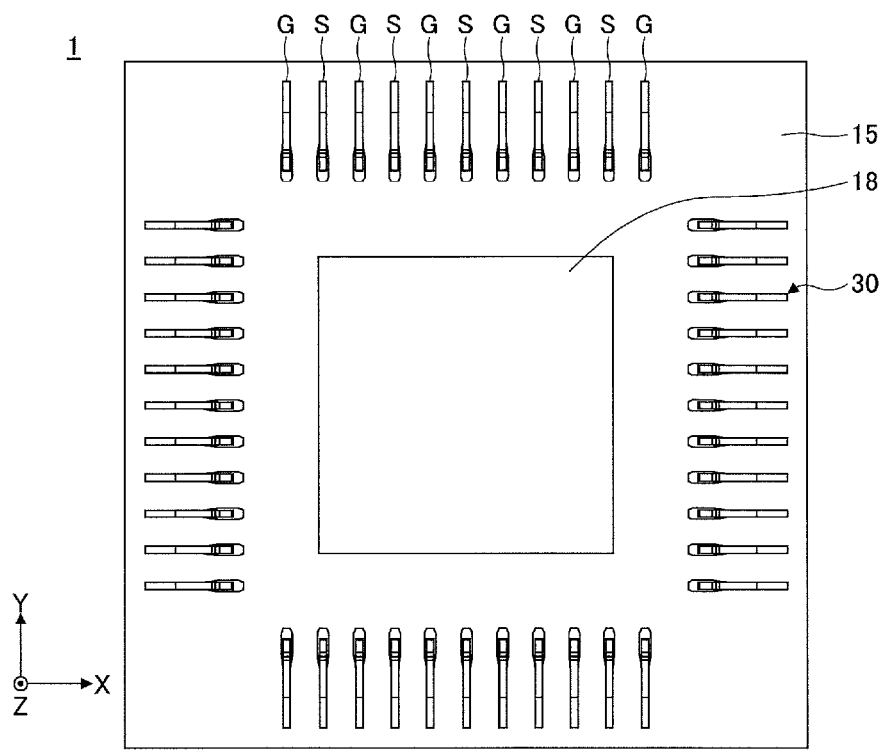

FIGS. 1A and 1B illustrate an example of a semiconductor apparatus 1 according to the first embodiment of the present invention. FIG. 1A is a cross-sectional view of the semiconductor apparatus 1. FIG. 1B is a plan view illustrating a part of FIG. 1A (mainly an arrangement of connection terminals 30). With reference to FIG. 1A, the semiconductor apparatus 1 includes a wiring substrate 10A, a wiring substrate 10B, bonding parts 21, 22, connection terminals 30, and a resin part 40.

In the semiconductor apparatus 1, the wiring substrate 10B is positioned above the wiring substrate 10A. Multiple connection terminals 30, which electrically connect the wiring substrate 10A and the wiring substrate 10B, are provided between the wiring substrate 10A and the wiring substrate 10B. The resin part 40, which encapsulates, for example, an electronic component 18 of the wiring substrate 10A and the connection terminals 30, is provided between the wiring substrate 10A and the wiring substrate 10B. The wiring substrate 10A is a representative example of a first wiring substrate according to an embodiment of the present invention, and the wiring substrate 10B is a representative example of a second wiring substrate according to an embodiment of the present invention.

In describing the semiconductor apparatus 1, for the sake of convenience, the term "one side" or the term "one surface" corresponds to a side or a surface that is positioned toward the electronic component 18 of the wiring substrate 10B, and the term "other side" or the term "other surface" corresponds to a side or surface that is positioned toward the solder resist layer 16 of the wiring substrate 10A.

The wiring substrate 10A includes an insulating layer 11, a wiring layer 12, a wiring layer 13, a through-wiring 14, a solder resist layer 15, a solder resist layer 16, a bonding part 17, and the electronic component 18.

For example, a so-called epoxy glass substrate, which is a substrate having an insulating resin (e.g., epoxy type resin) impregnated in a glass cloth, may be used as the insulating layer 11 of the wiring substrate 10A. Alternatively, the insulating layer 11 may be a substrate having an insulating resin (e.g., epoxy type resin) impregnated in a woven or non-woven cloth made of glass fiber, carbon fiber, or an aramid fiber. It is to be noted that the materials constituting the insulating layer 11 (e.g., glass cloth) are omitted from the accompanying drawings.

Alternatively, a substrate having, for example, silicon or ceramic as a main component may be used as the insulating layer 11. For example, in a case where silicon is used to form the insulating layer 11, an insulating property can be provided to a substrate by covering a surface of the substrate and inner walls of through-holes of the substrate with an insulating film (e.g., $SiO_2$). The thickness of the insulating layer 11 may be, for example, approximately 60 μm to 200 μm.

The wiring layer 12 is formed on one surface of the insulating layer 11. The wiring layer 13 is formed on the other surface of the insulating layer 11. The wiring layer 12 is electrically connected to the wiring layer 13 by way of the through-wiring 14 provided in a through-hole 11x penetrating the insulating layer 11. For example, copper (Cu) may be used as the material of the wiring layer 12, the wiring layer 13, and the through-wiring 14. The thickness of the wiring layer 12 and the thickness of the wiring layer 13 may be, for example, approximately 10 μm to 20 μm, respectively. The shape of the through-hole 11x from a plan view (plan-view shape) may be, for example, a circular shape having a diameter of approximately 50 μm. It is to be noted that the wiring layer 12, the wiring layer 13, and the through-wiring 14 may be integrally formed.

The solder resist layer 15 is formed on the one surface of the insulating layer 11 and covers the wiring layer 12. The solder resist layer 15 may be formed of, for example, a photosensitive resin. The thickness of the solder resist layer 15 may be, for example, approximately 15 μm to 35 μm. The solder resist layer 15 includes opening parts 15x, 15y. A part of the wiring layer 12 is exposed in each of the opening parts 15x, 15y. The part of the wiring layer 12 exposed in the opening part 15x and the part of the wiring layer 12 exposed in the opening part 15y constitute a pad 12a and a pad 12b, respectively. The plan-view shape of each of the opening parts 15x, 15y may be, for example, a circular shape. The diameter of each of the opening parts 15x, 15y may be arbitrarily set in correspondence with an object (connection object) to be connected to the pads 12a, 12b.

According to necessity, a metal layer may be formed on each of the one surfaces of the pads 12a, 12b. Alternatively, an anti-oxidation process such as an OSP (Organic Solderability Preservative) process may be performed on the one surfaces of the pads 12a, 12b. The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

The solder resist layer 16 is formed on the other surface of the insulating layer 11 and covers the wiring layer 13. For example, the material and the thickness of the solder resist layer 16 may be the same as the material and the thickness of the solder resist layer 15. The solder resist layer 16 includes an opening part 16x. A part of the wiring layer 13 is exposed in the opening part 16x. The part of the wiring layer 13 exposed in the opening part 16x constitutes a pad 13a. The plan-view shape of the opening part 16x may be, for example, a circular shape. The diameter of the opening part 16x may be arbitrarily set in correspondence with an object (connection object) to be connected to the pad 13a. The pad 13a functions as a pad that is to be electrically connected to a mounting substrate such as a motherboard (not illustrated). An external connection terminal such as a solder ball may be formed on the other surface of the pad 13a.

Alternatively, the solder resist layer 16 may be formed exposing the entire pad 13a. In a case where the solder resist layer 16 is formed exposing the entire pad 13a, the solder resist layer 16 may be provided, so that a side surface of the pad 13a and a side surface of the solder resist layer 16 contact each other. Alternatively, in a case where the solder resist layer 16 covers the entire pad 13a, the solder resist layer 16 may be provided, so that a space is formed between the side surface of the pad 13a and the side surface of the solder resist layer 16. According to necessity, similar to the above-described metal layer formed on the one surfaces of the pad 12a, 12b, a metal layer may be formed on the other surface of the pad 13a. Alternatively, an anti-oxidation process such as an OSP (Organic Solderability Preservative) process may be performed on the other surface of the pad 13a.

The electronic component 18 is mounted on the solder resist layer 15 by way of the bonding part 17 formed on the one surface of the pad 12a. For example, a solder material formed of an alloy such as an alloy including lead (Pb), an alloy including tin (Sn) and copper (Cu), an alloy including tin (Sn) and lead (Sb), an alloy including tin (Sn) and silver (Ag), or an alloy including tin (Sn), silver (Ag), and copper (Cu) may be used as the bonding part 17. Alternatively, a conductive paste such as a silver paste may be used as the bonding part 17. The electronic component 18 may be, for example, a semiconductor chip, a sensor, a capacitor, an inductor, or a resistor. The electronic component 18 is not limited to a single one of the aforementioned electronic components and may be an arbitrarily selected combination of the aforementioned electronic components.

The wiring substrate 10B has substantially the same structure as the above-described structure of the wiring substrate 10A except that the opening part 15y is not formed in the solder resist layer 15 (the pad 12b not provided). Therefore, details pertaining to the wiring substrate 10B are omitted. It is to be noted that at least one of the electronic components 18 mounted on or installed in the wiring substrate 10A or the wiring substrate 10B is a semiconductor chip.

The wiring substrate 10A is electrically connected to the wiring substrate 10B by way of multiple connection terminals 30. More specifically, each of the multiple connection terminals 30 has a fixing part 31 provided on one end thereof. The fixing part 31 is connected to the pad 12b of the wiring substrate 10A by way of a bonding part 21. Further, the through-wiring 14 is provided immediately below the pad 12b of the wiring substrate 10A. Thus, by providing the through-wiring 14 directly below the pad 12b that is bonded to the connection terminal 30, high frequency signals can be transmitted without loss.

Further, each of the multiple connection terminals 30 has a fixing part 32 provided on the other end thereof. The fixing part 32 is connected to the pad 13a of the wiring substrate 10B by way of a bonding part 22. Further, the through-wiring 14 is provided immediately above the pad 13a of the wiring substrate 10B. Thus, by providing the through-wiring 14 directly above the pad 13a that is bonded to the connection terminal 30, high frequency signals can be transmitted without loss.

For example, a solder material formed of an alloy such as an alloy including lead (Pb), an alloy including tin (Sn) and copper (Cu), an alloy including tin (Sn) and lead (Sb), an alloy including tin (Sn) and silver (Ag), or an alloy including tin (Sn), silver (Ag), and copper (Cu) may be used as the bonding parts 21, 22.

The connection terminals 30 may be arranged, for example, along a periphery of the electronic component 18 of the wiring substrate 10A. The pitch between the connection terminals 30 may be, for example, approximately 0.4 mm to 1.5 mm. It is to be noted that, although the connection terminals 30 are arranged in a single row along the periphery of the electronic component 18 of the wiring substrate 10A in FIG. 1, multiple rows of connection terminals 30 may be arranged along the periphery of the electronic component 18.

The multiple connection terminals 30 include a signal terminal S to which a signal is transmitted and a ground terminal G to be connected to, for example, a ground (GND). The ground terminals G are provided on both sides of the signal terminal S. Each of the signal terminals S and the ground terminals G has a substantially rectangular shape from a plan view. The signal terminals S and the ground terminals G are arranged, so that a long side of the rectangular shape of the signal terminal S and a long side of the rectangular shape of the ground terminal G face each other. Further, the signal terminals S and the ground terminals G are arranged, so that the spaces between the facing long sides of the signal terminals S and the ground terminals G are uniform. That is, the signal terminals S and the ground terminals G arranged adjacent to the signal terminals S form a coplanar structure in a thickness direction (Z direction) of the semiconductor apparatus 1. It is to be noted that a "plan view" is a point of view in which an object is observed from the Z direction (direction orthogonal to a plane on which the multiple connection terminals 30 are provided) of, for example, FIG. 1.

Although only a portion of the connection terminals 30 are indicated with the letter "S" or the letter "G" in FIG. 1B, the connection terminals 30 that are not indicated with the letter "S" or the letter "G" may also be the signal terminal S or the ground terminals G arranged on both sides of the signal terminal S. Alternatively, in a case where a region for transmitting high frequency signals is limited to a particular region, the connection terminals 30 that form the coplanar structure may be limited to only the connection terminals 30 arranged in the particular region. It is to be noted that power supply terminals are substantially equivalent to ground terminals from the standpoint of high frequency transmission. Therefore, "ground terminals arranged on both sides of a signal terminal" may include other terminals (e.g., power supply terminals) that are substantially equivalent to ground terminals from the standpoint of high frequency transmission and arranged on both sides of a signal terminal.

For example, the resin part 40 may be formed of a material that allows elastic deformation of the connection terminals 30. That is, the resin part 40 may be formed of a material that does not interfere with the plastic deformation of the connection terminals 30. One example of the material of the resin part 40 is elastomer. The elastomer may be, for example, a silicone type insulating resin. By providing the resin part 40, the strength and moisture resistance of the semiconductor apparatus 1 can be improved. Further, by selecting elastomer having a flexible property as the material of the resin part 40, the elastomer can allow the plastic deformation of the connection terminal 30 in addition to attaining the effects of improving the strength and moisture resistance of the semiconductor apparatus 1.

For example, in a case where one of the wiring substrates 10A, 10B is a substrate that includes an insulating resin as a main component and the other is a substrate that includes silicon or ceramic as a main component, thermal stress may occur between the wiring substrate 10A and the wiring substrate 10B because the wiring substrate 10A and the wiring substrate 10B have different thermal expansion coefficients. By using elastomer having a flexible property as the material of the resin part 40, plastic deformation can occur in the connection terminals 30 having a resilient property. Owing to the plastic deformation of the connection terminals 30, the connection terminals 30 can absorb the thermal stress caused by the difference of thermal coefficients between the wiring substrate 10A and the wiring substrate 10B. As a result, connection reliability between the wiring substrate 10A and the wiring substrate 10B can be improved.

It is to be noted that, in a case where there is no problem of thermal stress such as a case where the thermal coefficients between the wiring substrates 10A, 10B are the substantially the same, the material used for the resin part 40 may be, for example, an insulating resin (e.g., epoxy type resin) having a thermosetting property and including filler therein (so-called "mold resin"). By providing the resin part 40, the strength and the moisture resistance of the semiconductor apparatus 1 can be improved. However, in this case, plastic deformation of the connection terminals 30 cannot be caused due to the connection terminals 30 being fixed to the resin part 40.

Figure 2:
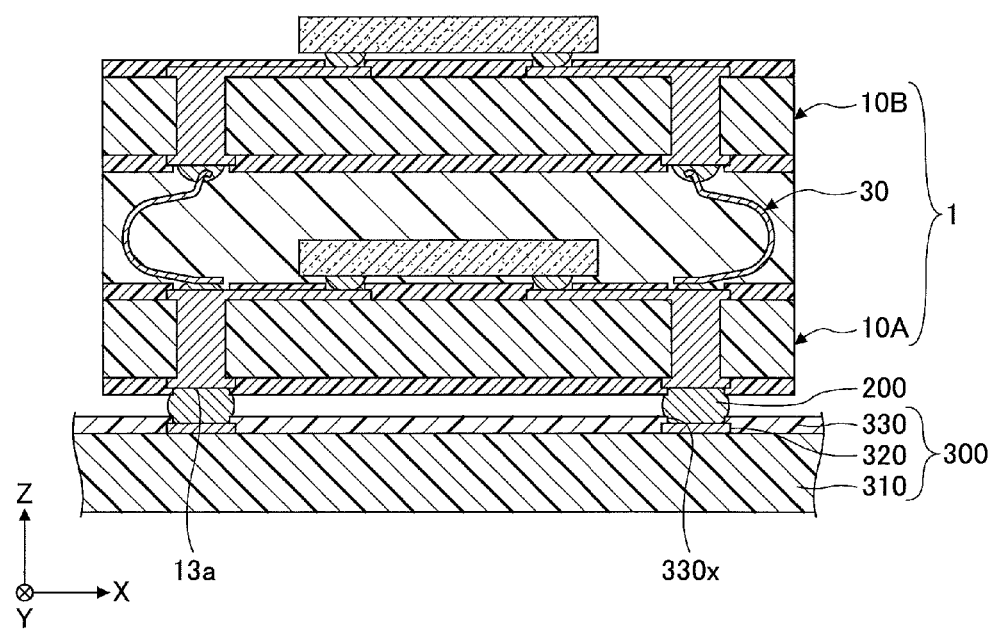
FIG. 2 is a cross-sectional view illustrating an example where the semiconductor apparatus of the first embodiment is mounted on a mounting substrate.

As illustrated in FIG. 2, the semiconductor apparatus 1 can be mounted on, for example, a mounting substrate 300 such as a motherboard by way an external connection terminal 200. The mounting substrate 300 includes, for example, an insulating layer 310, a wiring layer, and a solder resist layer 330. A pad 320, which is a part of the wiring layer, is formed on one surface of the insulating layer 310. A part of the pad 320 is exposed from an opening part 330x formed in the solder resist layer 330. The pad 13a of the semiconductor apparatus 1 and the pad 320 of the mounting substrate 300 are electrically connected to each other by way of the external connection terminal 200 such as a solder ball.

Figure 3A:
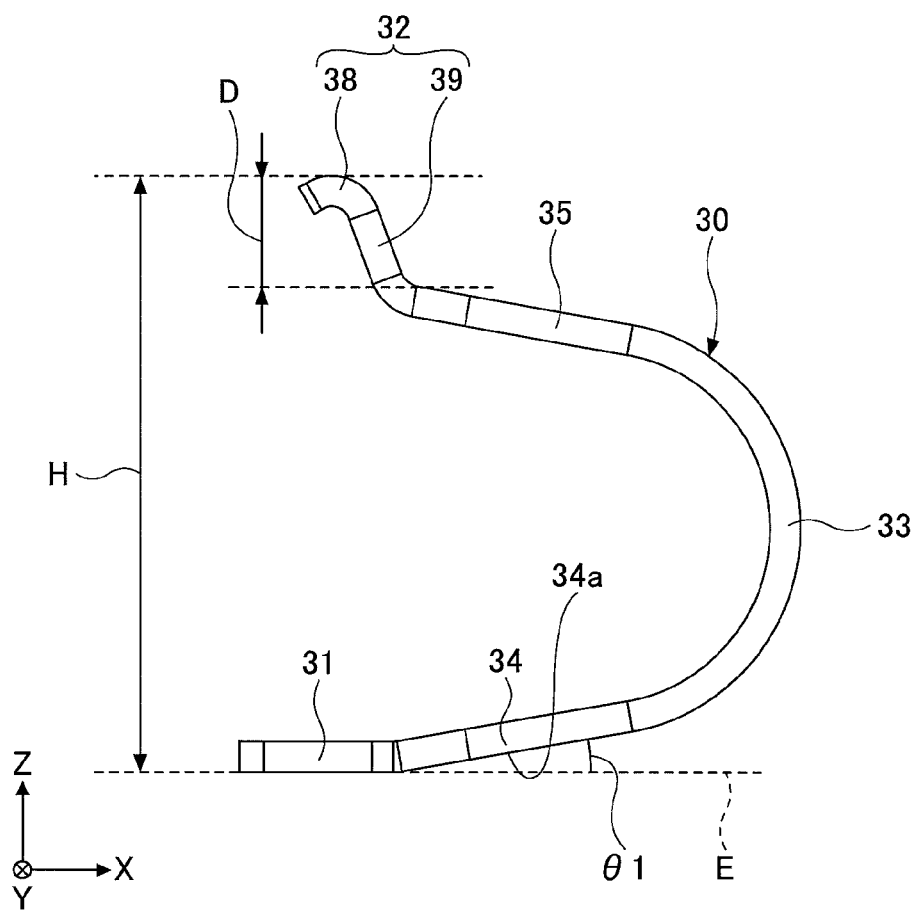
FIGS. 3A and 3B illustrate an example of a connection terminal of the first embodiment.
Figure 3B:
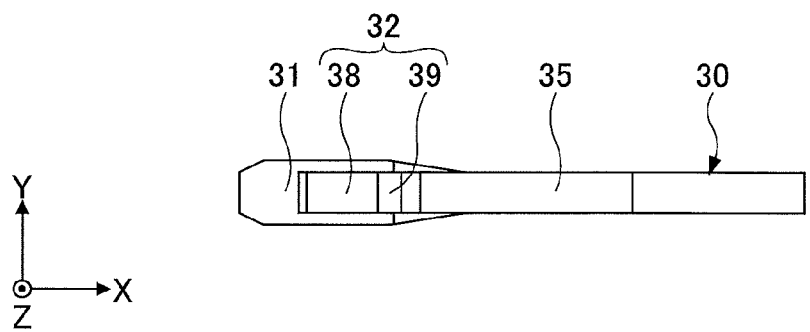

Next, the structure of the connection terminal 30 is described in further detail with reference to FIGS. 3A and 3B. FIGS. 3A and 3B illustrate an example of the connection terminal 30 of the first embodiment. FIG. 3A is a side view of the connection terminal 30 of the first embodiment. FIG. 3B is a plan view of the connection terminal 30 of the first embodiment. With reference to FIGS. 3A and 3B, the connection terminal 30, which is formed of a conductive member having a resilient (spring-like) property, includes a fixing part 31, a fixing part 32, a spring part 33, a first support part 34, and a second support part 35.

The fixing part 31 is formed on one end of the connection terminal 30. The fixing part 31 has a plate-like shape. The thickness (Z direction) of the fixing part 31 may be, for example, approximately 0.08 mm to 0.1 mm. The lateral width (Y direction) of the fixing part 31 may be, for example, approximately 0.3 mm to 0.4 mm. The longitudinal width (X direction) of the fixing part 31 may be, for example, approximately 0.4 mm to 0.5 mm.

The fixing part 32 is formed on the other end of the connection terminal 30. The fixing part 32 is positioned substantially facing the fixing part 31. The fixing part 32 is electrically connected to the fixing part 31 by way of the spring part 33, the first support part 34, and the second support part 35. The fixing part 32 includes a contact part 38 and a projecting part 39. The thickness of the fixing part 32 may be, for example, approximately 0.08 mm to 0.1 mm. The lateral width (Y direction) of the fixing part 32 may be, for example, approximately 0.2 mm to 0.3 mm. It is to be noted that the spring part 33, the first support part 34, and the second support part 35 may be collectively referred to as a curved part of the connection terminal 30.

The contact part 38 is a part of the fixing part 32 that contacts a pad of a target contact object. The contact part 38 has a round shape. In a case where a pressing force is exerted on the connection terminal 30, the contact part 38 moves mainly in the Z direction. By forming the contact part 38 into a round shape, the contact part 38 can be prevented from being damaged by the pad of the target contact object when the contact part 38 contacts the pad of the target contact object by the pressing force exerted on the contact part 38.

Further, in a case where a pressing force is exerted on the contact part 38 in the Z direction, the spring part 33 deforms, so that the deformation of the spring part 33 causes the contact part 38 to contact the pad of the target contact object in a state where the fixing part 32 is moved in a direction approaching the fixing part 31 (Z direction). Accordingly, when the pad of the target contact object and the fixing part 32 contact each other, the fixing part 32 can be prevented from significantly moving in a direction parallel to a surface on which the pad of the target contact object is formed. Therefore, the pads of the target contact object can be arranged in a narrow pitch. The pitch of the pads of the target contact object (pitch of the contact parts 38) may be, for example, approximately 0.4 mm to 1.5 mm.

The projecting part 39 has one end part that is integrally formed with the second support part 35 and another end part that is integrally formed with the contact part 38. The projecting part 39 projects from the second support part 35 in a direction toward the pad of the target contact object (direction separating from the fixing part 31).

The amount in which the projecting part 39 projects from the second support part 35 in a state where the fixing part 32 and the pad of the target contact object are not in contact (hereinafter also referred to as "projection amount D") may be, for example, 0.3 mm. The projection amount D is the amount of projection of the projection part 39 in a case where the criterion of the projection is a joint part between the second support part 35 and the projection part 39.

The spring part 33 is provided between the first support part 34 and the second support part 35. The first support part 34 and the second support part 35 are integrally formed. The spring part 33 has a curved shape such as a C-letter shape. The spring part 33 has a resilient property.

In a case where a pressing force is exerted on the fixing part 32 in the Z direction, the spring part 33 causes the fixing part 32 to repel against the pressing force in a direction toward the pad of the target contact object. The lateral width (Y direction) and the thickness of the spring part 33 may be, for example, the same as the lateral width (Y direction) and the thickness of the fixing part 32.

It is to be noted that, in reality, the first support part 34, the spring part 33, the second support part 35, and the fixing part 32, which constitute the connection terminal 30 of the first embodiment, integrally function as a spring. Thus, the portion of the connection terminal 30 that corresponds to the first support part 34, the spring part 33, the second support part 35, and the fixing part 32 has a spring constant of, for example, 0.6 N/mm to 0.8 N/mm.

The first support part 34 is provided between the spring part 33 and the fixing part 31. The first support part 34 has one end part that is integrally formed with the one end part of the spring part 33. The first support part 34 has another end part that is integrally formed with the fixing part 31. The first support part 34 has a plate-like shape.

The first support part 34 includes a surface 34a facing toward the wiring substrate 10A. The surface 34a forms an angle $\theta_1$ with respect to a plane E that includes a lower surface of the fixing part 31. The first support part 34 is formed, so that the predetermined angle $\theta_1$ is an acute angle. The angle $\theta_1$ may be, for example, 5 degrees to 15 degrees.

Thus, even in a case where the spring part 33 deforms when a pressing force is exerted on the contact part 38 in the Z direction, the first support part 34 can be prevented from contacting the target contact object by the deformation of the spring part 33 because the angle $\theta_1$ is formed to be an acute angle. The lateral width (Y direction) and the thickness of the first support part 34 may be, for example, the same as the lateral width (Y direction) and the thickness of the fixing part 32.

The second support part 35 is provided between the spring part 33 and the fixing part 32. The second support part 35 has one end part that is integrally formed with the other end part of the spring part 33. The second support part 35 has another end part that is integrally formed with the projecting part 39 of the fixing part 32. The second support part 35 has a plate-like shape. The lateral width (Y direction) and the thickness of the second support part 35 may be, for example, the same as the lateral width (Y direction) and the thickness of the fixing part 32. The height H of the connection terminal 30 in a state illustrated in FIG. 3A (i.e. a state where no pressing force is exerted on the fixing part 32 of the connection terminal 30) may be, for example, approximately 1.5 mm to 2 mm.

It is to be noted that, although the multiple connection terminals 30 of the first embodiment are arranged, so that the curved part of each of the multiple connection terminals 30 is faced outward of the semiconductor apparatus 1, the multiple connection terminals 30 are not limited to the arrangement of the first embodiment. For example, the multiple connection terminals 30 may be arranged, so that the curved parts of the multiple connection terminals 30 be faced in the same direction. That is, although the cross-sectional view of FIG. 1A illustrates the curved part of the connection terminals 30 facing opposite directions, the curved parts of the multiple connection terminals 30 may face the same direction. Thus, for example, the curved part of one or more connection terminals 30 may face outward of the semiconductor apparatus 1 whereas the curved part of another one or more connection terminals 30 may face inward of the semiconductor apparatus 1.

[Method for Manufacturing Semiconductor Apparatus of First Embodiment]

Next, a method for manufacturing a semiconductor apparatus according to the first embodiment of the present invention is described. FIGS. 4A to 6B illustrate processes for manufacturing the semiconductor apparatus of the first embodiment.

Figure 4A:
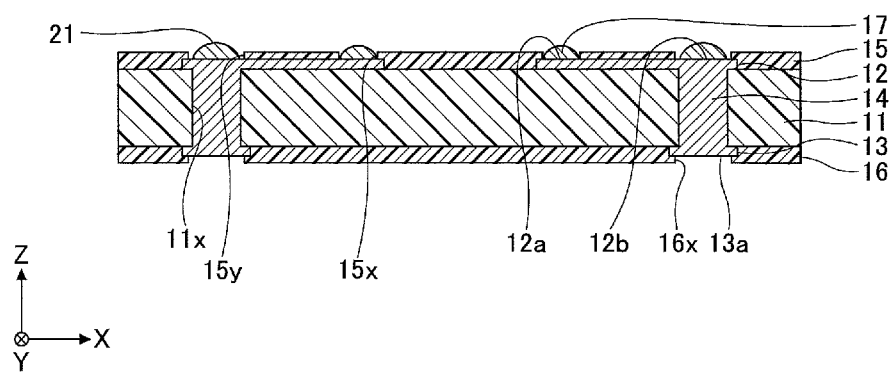
FIGS. 4A to 4C illustrate processes for manufacturing the semiconductor apparatus of the first embodiment (part 1)
Figure 4B:
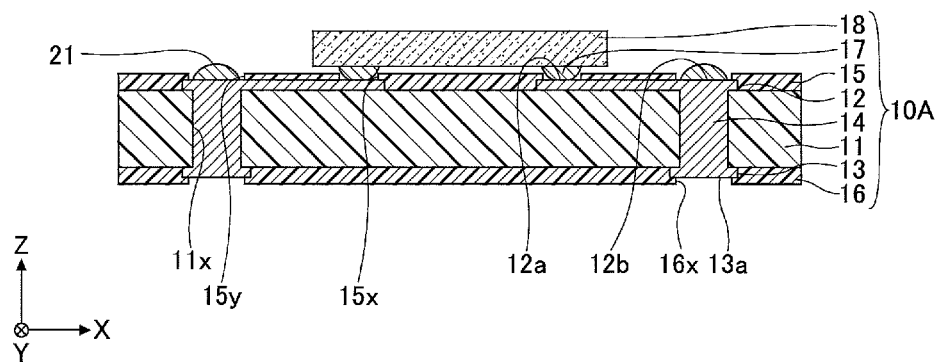

First, in the processes illustrated in FIGS. 4A and 4B, the wiring substrate 10A having the bonding part 21 formed on the pad 12b is manufactured. More specifically, in the process illustrated in FIG. 4A, an insulating layer 11 using, for example, the so-called glass epoxy substrate is prepared. Then, the through-hole 11x that penetrates the insulating layer 11 is formed by performing, for example, a laser process (e.g., $CO_2$ laser) on the insulating layer 11. Then, the wiring layer 12 is formed on the one surface of the insulating layer 11, the wiring layer 13 is formed on the other surface of the insulating layer 11, and the through-wiring 14 that electrically connects the wiring layer 12 and the wiring layer 13 is formed in the through-hole 11x.

The wiring layer 12, the wiring layer 13, and the through-wiring 14 may be formed as follows. First, a seed layer that continuously covers the one and the other surfaces of the insulating layer 11 and an inner side surface of the through-hole 11x is formed by using, for example, an electroless plating method. The seed layer may be formed of, for example, copper. Then, a resist layer, which includes opening parts corresponding to the wiring layer 12, the wiring layer 13, and the through-wiring 14, is formed on the seed layer. Then, a conductive layer is formed on the seed layer in the opening parts. The conductive layer is formed by using, for example, an electroplating method where the seed layer is used as a power feeding layer. The conductive layer may be formed of, for example, copper. After removing the resist layer, a portion of the seed layer that is not covered by the conductive layer is removed. Thereby, the wiring layer 12, the wiring layer 13, and the through-wiring 14 are formed, in which each of the layers 12-14 include the seed layer and the conductive layer.

Then, the solder resist layer 15 that covers the wiring layer 12 is formed on the one surface of the insulating layer 11. The solder resist layer 16 that covers the wiring layer 13 is formed on the other surface of the insulating layer 11. The solder resist layer 15 may be formed on the one surface of the insulating layer 11 and cover the wiring layer 12 by applying a liquid or paste-like photosensitive epoxy type insulating resin on the one surface of the insulating layer 11. The liquid or paste-like photosensitive epoxy type insulating resin may be applied by using, for example, a screen printing method, a roll coating method, or a spin coating method.

Similarly, the solder resist layer 16 may be formed on the other surface of the insulating layer 11 and cover the wiring layer 13 by applying a liquid or paste-like photosensitive epoxy type insulating resin on the other surface of the insulating layer 11. Alternatively, instead of applying the liquid or paste-like photosensitive epoxy type insulating resin, the solder resist layers 15, 16 may be formed by laminating a film-like photosensitive epoxy type insulating resin.

Then, the opening parts 15x, 15y, and 16x are formed on the solder resist layers 15, 16 by exposing and developing the applied or laminated insulating resin (photolithographic method). Thereby, the pads 12a, 12b, and 13a are formed in the opening parts 15x, 15y, and 16x. Then, the bonding part 17 is formed on the pad 12a, and the bonding part 21 is formed on the pad 12b. At this stage, the bonding parts 17, 21 may be, for example, a solder paste in an uncured state. The bonding parts 17, 21 may be formed by using, for example, a printing method.

It is to be noted that the opening parts 15x, 15y, 16x may be formed by a laser processing method or a blasting method. The plan-view shape of each of the opening parts 15x, 15y, 16x may be, for example, a circular shape. The diameter of each of the opening parts 15x, 15y, 16x may be arbitrarily set in correspondence with an object to be connected thereto.

Then, in the process illustrated in FIG. 4B, the electronic component (e.g., semiconductor chip) 18 is mounted on the pad 12a by way of the bonding part 17. Then, an electrode (not illustrated) of the electronic component 18 and the pad 12a are bonded by using, for example, a reflow method to melt and cure the bonding part 17 formed in the pad 12a. The bonding part 21 that is formed in the pad 12b is also melted and cured at the same time of melting and curing the bonding part 17. Thereby, the forming of the wiring substrate 10A having the bonding part 21 formed on the pad 12b is completed.

Figure 4C:
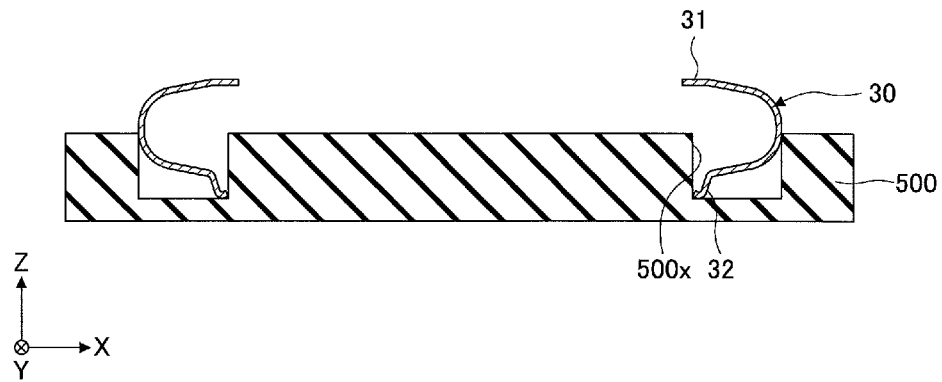

Then, in the process illustrated in FIG. 4C, a jig 500 for arranging the connection terminals 30 is prepared. The jig 500 includes grooves 500x into which the connection terminals 30 are to be inserted. The grooves 500x are formed in positions corresponding to the arrangement of the connection terminals 30 illustrated in FIG. 1B. The groove 50x has a depth that is less than the height of the connection terminal 30. Then, multiple connection terminals 30 are formed. The multiple connection terminals 30 are inserted into the grooves 500x, so that the fixing part 32 of each connection terminal 30 is positioned on a side of a bottom surface of the corresponding groove 500x, the fixing part 31 of each connection terminal 30 projects from the corresponding groove 500x, and the curved part of each connection terminal 30 faces a side of an outer edge of the jig 500.

The connection terminal 30 may be formed as follows. First, a metal plate (not illustrated) made of, for example, a Cu type alloy is prepared. Then, the metal plate is stamped into a predetermined shape. In this case, the metal plate may be stamped into, for example, an elongated shape. Then, an Ni plating film having a thickness of, for example, 1 μm to 3 μm is formed on an entire front surface of the elongated metal plate. Then, an Au plating film having a thickness of, for example, 0.3 μm to 0.5 μm is partly layered on the Ni plating film. That is, the Au plating film is layered on parts of the Ni plating film that are formed in areas corresponding to the fixing part 31 and the contact part 38. Then, a bending process is performed on the metal plate having the Ni plating film and the Au plating film formed thereon.

For example, phosphor bronze, beryllium copper, or a Corson copper alloy may be the Cu type alloy used as the material of the metal plate. Alternatively, the connection terminal 30 may be formed by etching a metal plate (not illustrated) made of, for example, Cu alloy, into a predetermined shape and performing the bending process on the etched metal plate.

Figure 5A:
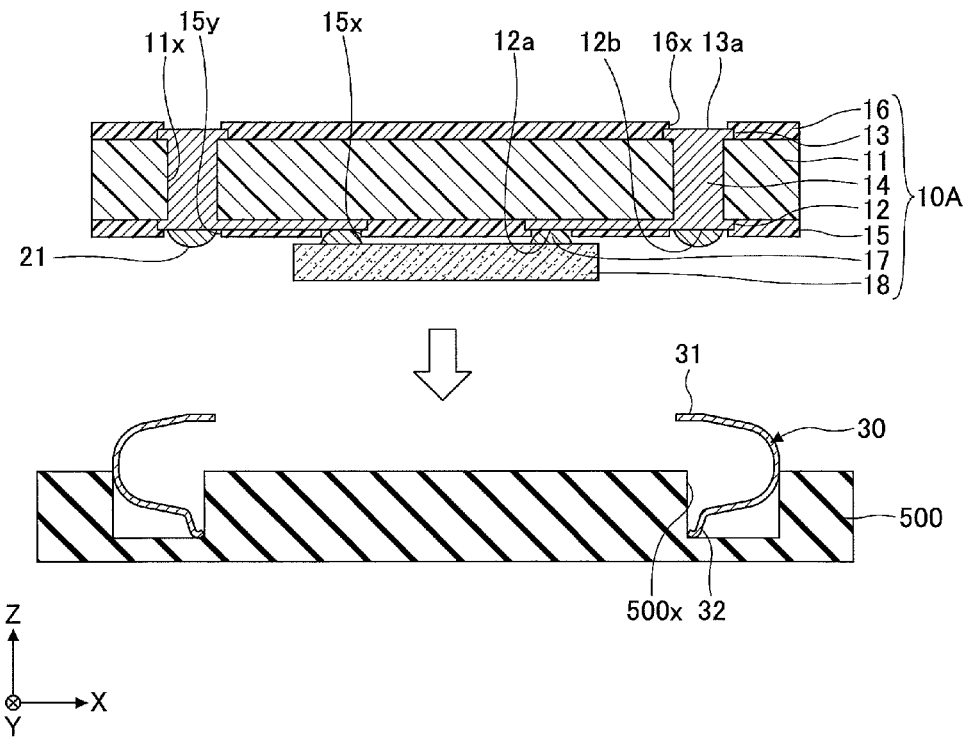
FIGS. 5A and 5B illustrate processes for manufacturing the semiconductor apparatus of the first embodiment (part 2)

Then, in the process illustrated in FIG. 5A, the wiring substrate 10A, which has the bonding part 21 formed on the pad 12b (i.e., wiring substrate 10A formed by the processes illustrated in FIGS. 4A and 4B), is inverted upside-down. In this inverted state, the wiring substrate 10A is mounted on the jig 500 having the connection terminals 30 inserted into the grooves 500. When mounting the wiring substrate 10A on the jig 500, the wiring substrate 10A and the jig 500 are aligned, so that each bonding part 21 of the wiring substrate 10A is positioned facing the fixing part 31 of the corresponding connection terminal 30 of the jig 500. Thereby, each bonding part 21 contacts the fixing part 31 of the corresponding connection terminal 30.

Figure 5B:
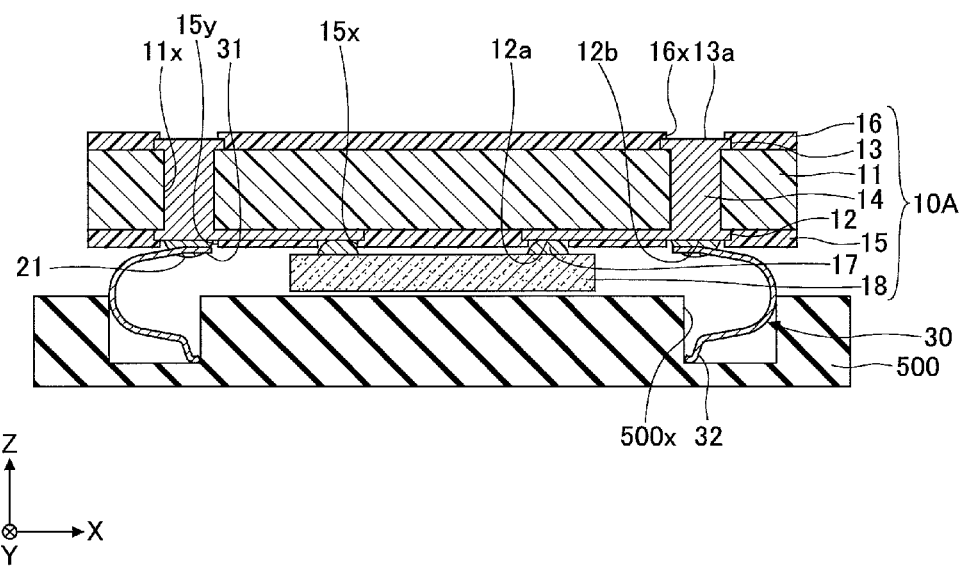

Then, in the process illustrated in FIG. 5B, the fixing part 31 of each connection terminal 30 and the pad 12b are bonded by using, for example, a reflow method to melt and cure the bonding part 21 formed in the pad 12b. Then, the wiring substrate 10A having the connection terminals 30 bonded to corresponding pads 12b is removed from the jig 500. It is to be noted that, in the process of bonding the fixing part 31 of each connection terminal 30 and the corresponding pad 12b, the interval between adjacent connection terminals 30 may deviate approximately 10 μm with respect to a designed value (e.g., approximately 1 mm). However, this deviation hardly affects the impedance adjustment value of the coplanar structure formed by the connection terminals 30.

Figure 6A:
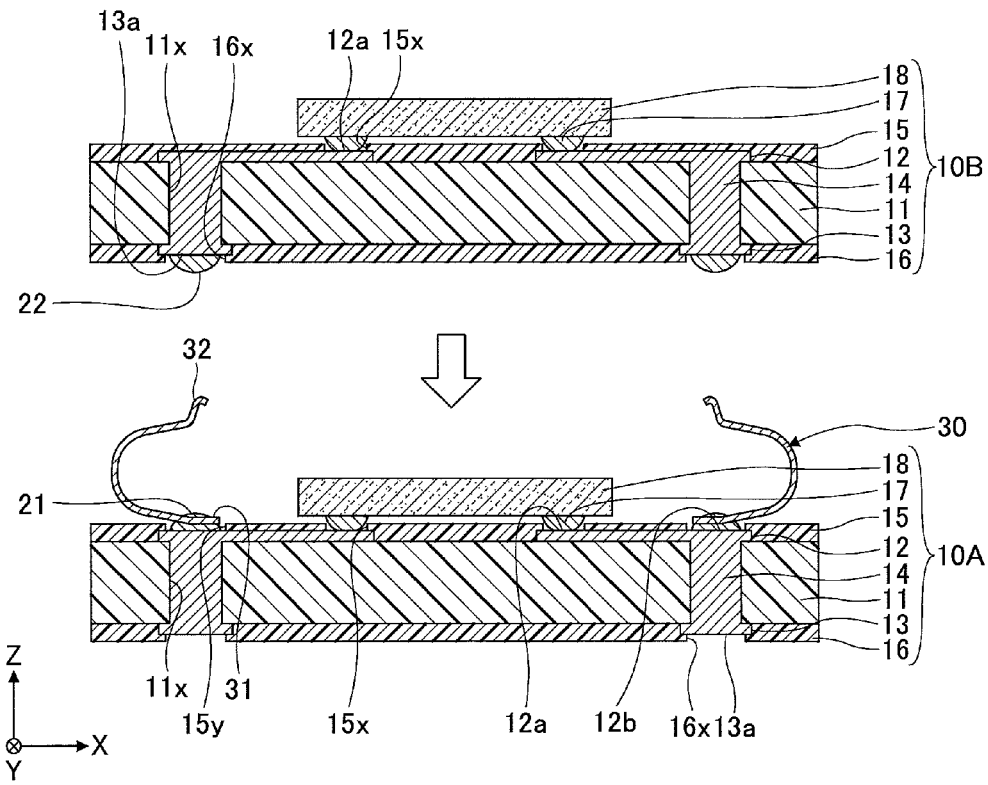
FIGS. 6A and 6B illustrate processes for manufacturing the semiconductor apparatus of the first embodiment (part 3)

Then, in the process illustrated in FIG. 6A, the wiring substrate 10B including the bonding part 22 formed on the pad 13a and having the electronic component 18 mounted thereon is formed by performing the same processes illustrated in FIGS. 4A and 4B. At this stage, the bonding part 22 is, for example, a solder paste in an uncured state. Then, the wiring substrate 10A, which has the connection terminals 30 bonded to corresponding pads 12b, is inverted upside-down with respect to the state illustrated in FIG. 5B. Then, in this state where the wiring substrate 10A is inverted, the wiring substrate 10B having the bonding part 22 formed on the pad 13a is mounted on the wiring substrate 10A.

When mounting the wiring substrate 10B on the wiring substrate 10A, the wiring substrate 10A and the wiring substrate 10B are aligned, so that each bonding part 22 of the wiring substrate 10B is positioned facing the fixing part 32 of the corresponding connection terminal 30. Thereby, each bonding part 22 contacts the fixing part 32 of the corresponding connection terminal 30. It is to be noted that the connection terminal 30 becomes into a slightly compressed state due to the weight of the wiring substrate 10B.

Figure 6B:
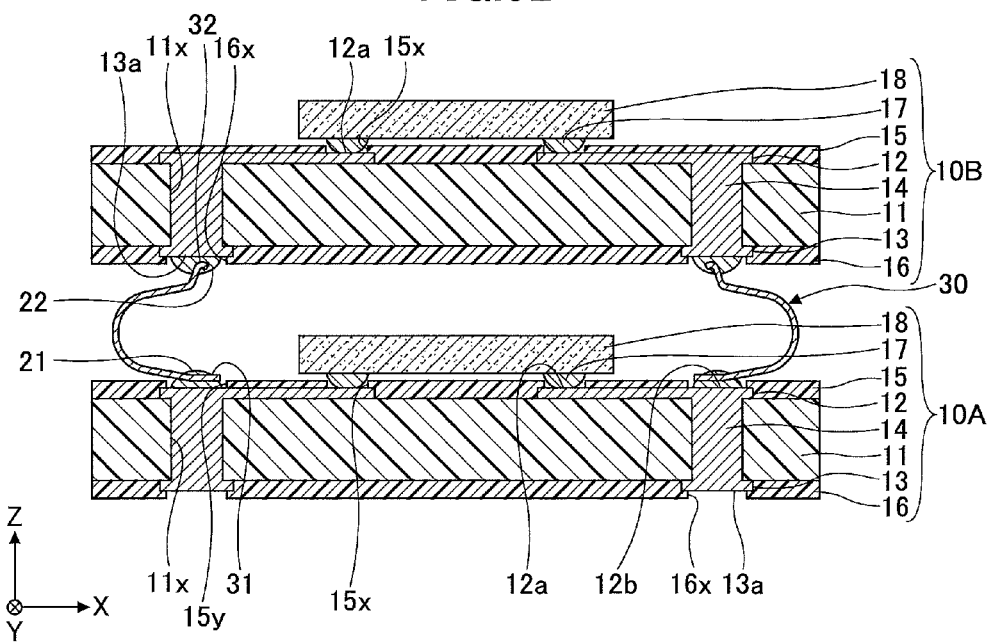

Then, in the process illustrated in FIG. 6B, the fixing part 32 of each connection terminal 30 and the corresponding pad 13a of the wiring substrate 10B are bonded by using, for example, a reflow method to melt and cure the bonding part 22 formed on the pad 13a of the wiring substrate 10B. Then, the resin part 40 is formed between the wiring substrate 10A and the wiring substrate 10B, for example, by using a transfer molding method to supply resin between the wiring substrates 10A, 10B. Thereby, the manufacturing of the semiconductor apparatus 1 illustrated in FIG. 1 is completed.

Next, effects attained by the semiconductor apparatus 1 according to an embodiment of the present invention are described along with a comparative example.

Figure 7A:
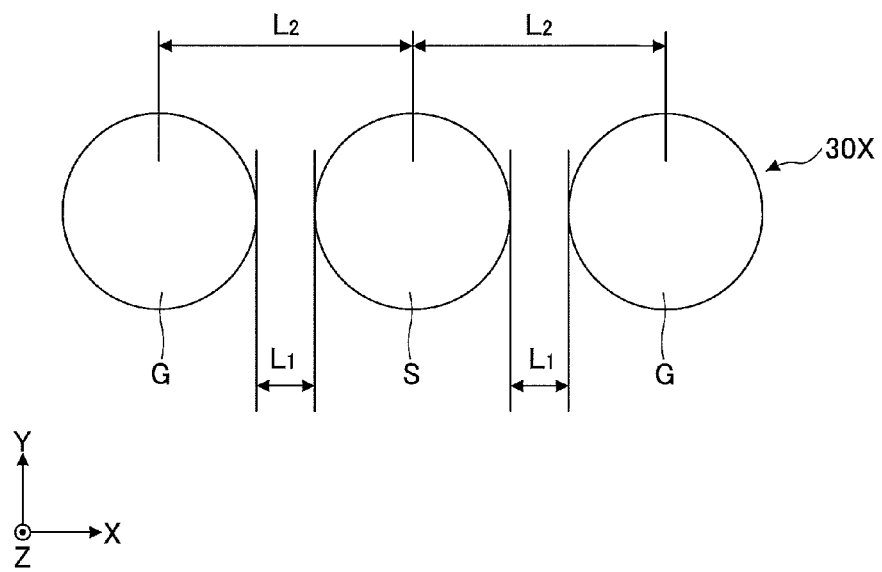
FIGS. 7A and 7B are plan views for describing an arrangement of connection terminals.
Figure 7B:
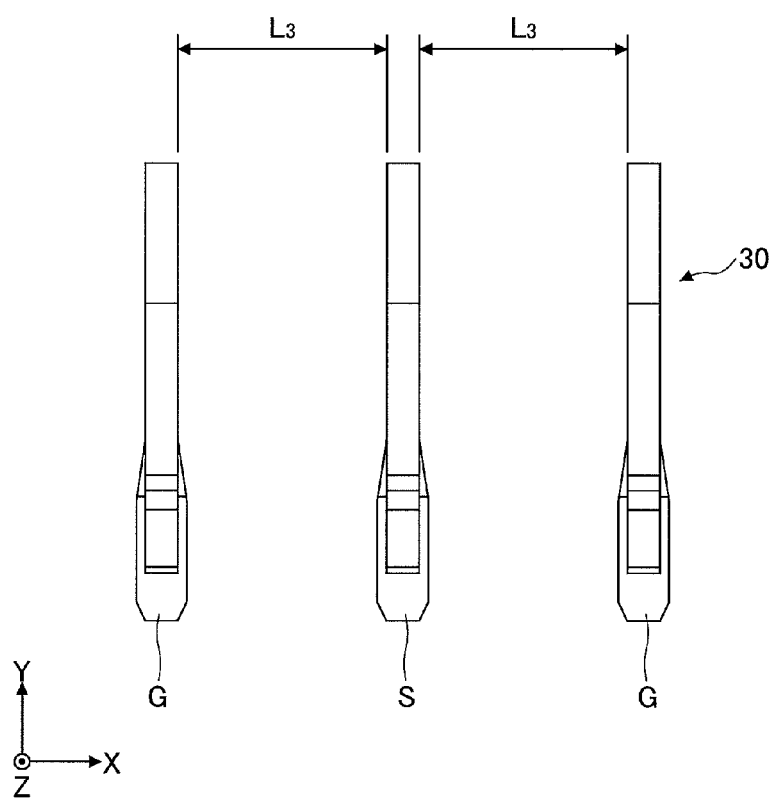

FIG. 7A illustrates connection terminals 30X of the comparative example. FIG. 7B illustrates the connection terminals 30 according to an embodiment of the present invention.

The comparative example is assumed to be a case where the connection terminals 30 of the semiconductor apparatus 1 illustrated in FIG. 1 are replaced with the connection terminals 30X such as solder balls. As illustrated in FIG. 7A, a ground terminal G and a signal terminal S are arranged adjacent to each other. Because the connection terminal 30X has a spherical shape, the interval (X direction) between the signal terminal S and the ground terminal G is not constant and is different depending on the position in the Y direction and the Z direction. That is, the shortest interval (X direction) between the signal terminal S and the ground terminal G is $L_1$ whereas the longest interval (X direction) between the signal terminal S and the ground terminal G is $L_2$. Thus, the interval (X direction) between the signal terminal S and the ground terminal G is not constant and changes between $L_1$ and $L_2$ depending on the position in the Y direction and the Z direction.

Although impedance can be adjusted according to the interval (distance) between the signal terminal S and the ground terminal G, impedance adjustment is difficult for the connection terminal 30X of the comparative example because the interval between the signal terminal S and the ground terminal G cannot be constant. The difficulty is the same even in a case where the connection terminal 30X is a resin core ball having a solder material covering the surrounding of a substantially spherical-shaped resin core or a copper core ball having a solder material covering the surround of a substantially spherical-shaped copper core.

On the other hand, the connection terminals 30 according to an embodiment of the present invention have a substantially rectangular shape from a plan view. Therefore, with the adjacently arranged signal terminal S and ground terminal G as illustrated in FIG. 7B, the interval (X direction) between a side of the signal terminal S and a side of the ground terminal G that face each other is constant ($L_3$) regardless of the position in the Y direction or the Z direction. Therefore, impedance can be easily adjusted according to the interval (distance) between the signal terminal S and the ground terminal G.

That is, because impedance can be matched at the part of the connection terminal 30, high frequency signals can be transmitted. Thus, the range of electronic components that can be selected to be mounted on (installed in) the semiconductor apparatus 1 can be broadened. In addition, the degree of freedom of arranging electronic components in the semiconductor apparatus 1 can be improved.

For example, in a case of transmitting high frequency signals of several GHz to several tens of GHz, impedance can be adjusted to approximately 50 Ω by adjusting the interval (distance) between the signal terminal S and the ground terminal G to approximately 1 mm. However, in a case where the signal terminal S and the ground terminal G are encapsulated in the resin part 40, impedance may change according to the dielectric constant of the resin material included in the resin part 40. Therefore, the interval (distance) between the signal terminal S and the ground terminal G is to be determined by taking the dielectric constant of the resin material into consideration.

It is to be noted that a constant interval between the signal terminal S and the ground terminal G not only includes a case where the interval between the signal terminal S and the ground terminal G is strictly constant but may also include a case where the intervals between the signal terminal S and the ground terminals G are slightly different as long as predetermined effects of the embodiment of the present invention can be attained. For example, as described above, in the process of bonding the fixing part 31 of each connection terminal 30 and the corresponding pad 12b, the interval between adjacent connection terminals 30 may deviate approximately 10 μm with respect to a designed value (e.g., approximately 1 mm). However, this deviation hardly affects the impedance adjustment value of the coplanar structure formed by the connection terminals 30. In other words, "constant interval" includes a case where the interval between adjacent connection terminals 30 varies approximately 10 μm.

Further, the material included in the connection terminal 30X such as a solder material containing PB (e.g., solder ball) does not have a satisfactory high frequency characteristic and is not suitable for transmitting high frequency signals. On the other hand, the connection terminal 30 is formed of, for example, a Cu type alloy (e.g., phosphor bronze, beryllium copper, or a Corson copper alloy) having a satisfactory high frequency characteristic. From this standpoint also, a transmission path using the connection terminal 30 is suitable for transmitting high frequency signals.

Accordingly, with the first embodiment, multiple connection terminals 30, which have substantially rectangular shapes from a plan view, are arranged, so that the longitudinal sides of the rectangular shapes of the connection terminals 30 face the same direction. Further, among the multiple connection terminals 30, one connection terminal 30 is assigned as a signal terminal S and two other connection terminals 30 are assigned as ground terminals G provided on both sides of the one connection terminal 30 assigned as the signal terminal S. Accordingly, a coplanar structure can be formed by adjacently arranging the signal terminal S and the ground terminals G, so that intervals (distance) between the signal terminal S and the ground terminals G are constant. As a result, by changing the interval (distance) between the signal terminal S and the ground terminals G, impedance can be easily adjusted. Thereby, high frequency (e.g., several GHz to several tens of GHz) current can be supplied by way of the signal terminal S.

Further, cross-talk between signal terminals S can be prevented because signal terminals S are not arranged adjacent to each other but have a ground terminal G interposed therebetween.

Further, in a case where a material having a flexible property (e.g., silicone resin) is used as the resin part 40, the thermal stress caused by the difference of thermal expansion coefficients between the wiring substrates 10A, 10B can be absorbed because the resin part 40 allows the plastic deformation of the connection terminal 30 having a resilient property. As a result, connection reliability between the wiring substrate 10A and the wiring substrate 10B can be improved.
(First Modified Example of First Embodiment)

In a first modified example of the first embodiment, a semiconductor apparatus does not include a resin part. In the first modified example, like components are denoted with like reference numerals as of the reference numerals of the first embodiment and are not further explained.

Figure 8:
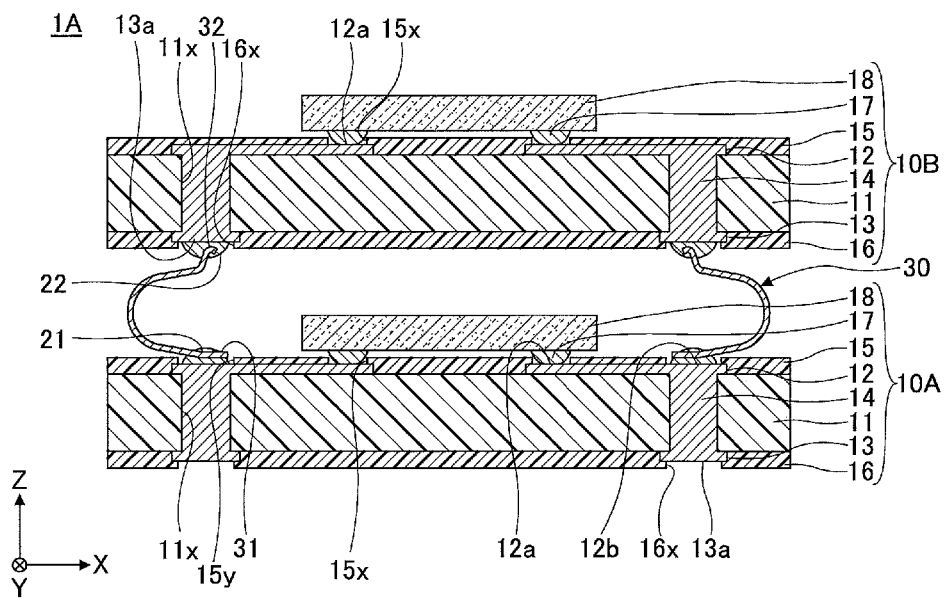
FIG. 8 is a cross-sectional view illustrating a semiconductor apparatus according to a first modified example of the first embodiment.

FIG. 8 is a cross-sectional view illustrating a semiconductor apparatus 1A according to the first modified example of the first embodiment. With reference to FIG. 8, the semiconductor apparatus 1A of the first modified example is different from the semiconductor apparatus 1 of the first embodiment in that a resin part is not included in the semiconductor apparatus 1A.

Accordingly, the space between the vertically adjacent wiring substrates 10A, 10B having the connection terminals 30 interposed therebetween can be made hollow by not filling the space with resin. Even in this case, the thermal stress caused by the difference of thermal expansion coefficients between the wiring substrates 10A, 10B can be absorbed because owing to the plastic deformation of the connection terminal 30 having a resilient property.
(Second Modified Example of First Embodiment)

In a second modified example of the first embodiment, a semiconductor apparatus has connection terminals facing a direction different from that of the first embodiment. In the second modified example, like components are denoted with like reference numerals as of the reference numerals of the first embodiment and are not further explained.

Figure 9:
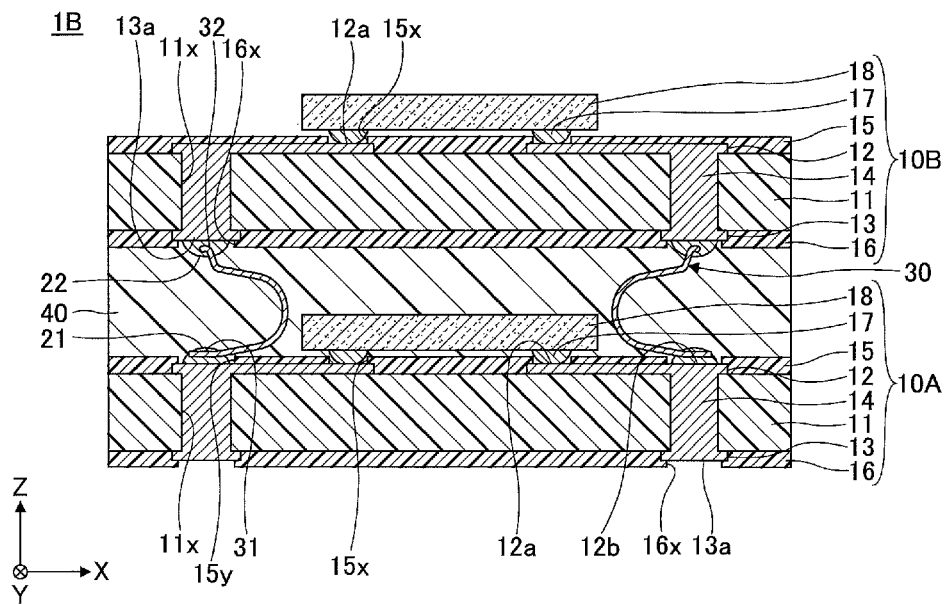
FIG. 9 is a cross-sectional view illustrating a semiconductor apparatus according to a second modified example of the first embodiment.

FIG. 9 is a cross-sectional view illustrating a semiconductor apparatus 1B according to the second modified example of the first embodiment. With reference to FIG. 9, the semiconductor apparatus 1B of the first modified example is different from the semiconductor apparatus 1 of the first embodiment (see FIG. 1) in that the curved part of each of the multiple connection terminals 30 is faced inward of the semiconductor apparatus 1.

Accordingly, even in a case where the curved parts of the multiple connection terminals 30 are arranged to face inward of the semiconductor apparatus 1, the second modified example can attain the same effects as the first embodiment that has the curved parts of the multiple connection terminals facing outward of the semiconductor apparatus 1.
<Second Embodiment>

According to a second embodiment of the present invention, a semiconductor apparatus has connection terminals provided in multiple layers. In the second embodiment, like components are denoted with like reference numerals as of the reference numerals of the first embodiment and are not further explained.

Figure 10:
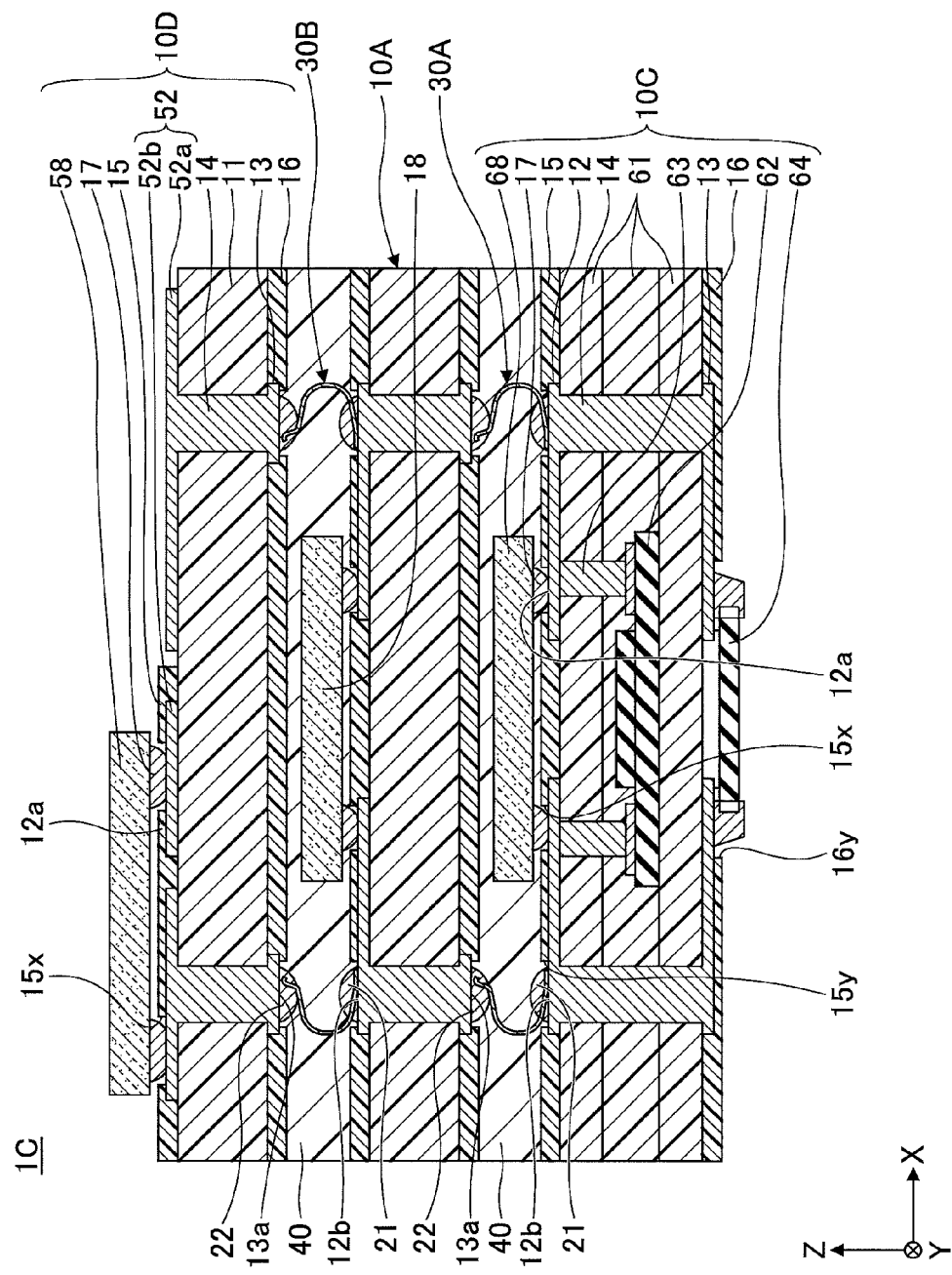
FIG. 10 is a cross-sectional view illustrating an example of a semiconductor apparatus according to a second embodiment of the present invention.

FIG. 10 is a cross-sectional view illustrating a semiconductor apparatus 1C according to the second embodiment of the present invention. With reference to FIG. 10, the semiconductor apparatus 1C includes a wiring substrate 10A, a wiring substrate 10C, a wiring substrate 10D, a bonding part 21, a bonding part 22, a connection terminal 30A, a connection terminal 30B, and the resin part 40.

In the semiconductor apparatus 1, the wiring substrate 10A is layered on the wiring substrate 10C by way of the connection terminal 30A. Further, the wiring substrate 10D is layered on the wiring substrate 10A by way of the connection terminal 30B. The resin part 40 is provided between the wiring substrate 10C and the wiring substrate 10A. The resin part 40 is also provided between the wiring substrate 10A and the wiring substrate 10D. It is to be noted that the connection terminal 30A and the connection terminal 30B are denoted with different reference numerals for the sake of convenience. However, the connection terminals 30A, 30B are the same as the above-described connection terminal 30.

The wiring substrate 10C is different from the wiring substrate 10A in that the insulating layer 11 is replaced by three insulating layers 61 that include, for example an epoxy type resin, as a main component. The wiring substrate 10C is also different from the wiring substrate 10A in that a secondary battery 62 installed inside a middle insulating layer of the three insulating layers 61. The wiring substrate 10C is also different from the wiring substrate 10A in that a pad of the secondary battery 62 and the wiring layer 12 are connected by a through-wiring 63. For example, a lithium type battery may be installed as the secondary battery 62.

In addition, the wiring substrate 10C is different from the wiring substrate 10A in that a power generating device 64, which is to be connected to the wiring layer 13, is mounted in an opening part 16y of the solder resist layer. The wiring substrate 10C is also different from the wiring substrate 10A in that the electronic component 18 is replaced with a semiconductor chip 68. For example, an optical power generating device, a thermal power generating device, or a vibration power generating device may be mounted as the power generating device 64.

The wiring substrate 10C is electrically connected to the wiring substrate 10A by way of multiple connection terminals 30A. More specifically, the fixing part 31 of each connection terminal 30A is bonded to the pad 12b of the wiring substrate 10C by way of the bonding part 21. Further, the fixing part 32 of each connection terminal 30A is bonded to the pad 13a of the wiring substrate 10A by way of the bonding part 22.

The wiring substrate 10D is different from the wiring substrate 10A in that the wiring layer 12 is replaced with a wiring layer 52 that includes an antenna 52a and a wiring 52b. The wiring substrate 10D is also different from the wiring substrate 10A in that the electronic component 18 is replaced with a sensor 58. For example, various sensors such as a temperature sensor or an illumination sensor may be used as the sensor 58.

The wiring substrate 10D is electrically connected to the wiring substrate 10A by way of multiple connection terminals 30B. More specifically, the fixing part 31 of each connection terminal 30B is bonded to the pad 12b of the wiring substrate 10A by way of the bonding part 21. Further, the fixing part 32 of each connection terminal 30B is bonded to the pad 13a of the wiring substrate 10D by way of the bonding part 22.

The semiconductor apparatus 1C is a sensor that performs wireless transmission by using the antenna 52a to transmit various data (e.g., temperature, luminance) detected by the sensor 58 to a host. In the semiconductor apparatus 1C, the electronic component 18 is a semiconductor chip that functions as, for example, a wireless RFIC (Radio Frequency Integrated Circuit) or a CPU. Further, in the semiconductor apparatus 1C, the semiconductor chip 68 functions as an IC for managing a power source such as the second battery 62 or the power generating apparatus 64.

The secondary battery 62 and the power generating apparatus 64 are assembled to the semiconductor apparatus 1C. Accordingly, the electric energy generated by the power generating apparatus 64 is stored in the secondary battery 62, and the electric energy stored in the secondary battery 62 is supplied to, for example, the electronic component (e.g., semiconductor chip) 18 or the semiconductor chip 68.

Thereby, the semiconductor apparatus 1C can self-sustainably operate.

The secondary battery 62 installed in the wiring substrate 10C includes electrolyte. Accordingly, the electrolyte expands or contracts when the secondary battery 62 charges or discharges. The thermal expansion coefficient of the secondary battery 62 is significantly different from the thermal expansion coefficient of the material of, for example, the insulating layer or wiring layer included in each of the wiring substrates. Therefore, the thermal expansion coefficient of the entire wiring substrate 10C is also different from the thermal expansion coefficient of the entire wiring substrate 10A.

Therefore, when the wiring substrate 10C expands or contracts in accordance with the charge or discharge of the secondary battery 62, a large amount of thermal stress is applied to a part at that connects the wiring substrate 10C and the wiring substrate 10A. Thus, supposing that a solder bump or the like is used at the part as the wiring substrate 10A, 10C are connected, the solder bump or the like may crack or break (disconnection) due to large thermal stress applied to the solder bump or the like.

However, with the second embodiment, the part that connects the wiring substrate 10C and the wiring substrate 10A is not the solder bump or the like but is the connection terminal 30A having a resilient property. Thus, even in a case where thermal stress is generated due to the difference of thermal expansion coefficients of the wiring substrates 10A, 10C, the connection terminal 30A can absorb the thermal stress. As a result, connection reliability between the wiring substrate 10A and the wiring substrate 10C can be improved.

Hence, with the above-described second embodiment, the following effects can be attained in addition to the effects attained by the first embodiment. That is, because the semiconductor apparatus of the second embodiment includes wiring substrates installed with electronic components that expand or contract in accordance with operation of the semiconductor apparatus, thermal expansion coefficients are different among the wiring substrates. However, similar to the case where thermal expansion coefficients are different depending on the material of the wiring substrate, the thermal stress generated by the difference of thermal expansion coefficients among the wiring substrates can be absorbed owing to the plastic deformation of the connection terminal having a resilient property. As a result, connection reliability between the wiring substrates can be improved. It is, however, to be noted that a material having a flexible property (e.g., silicone resin) is to be used as the resin part 40.

<Third Embodiment>

According to a third embodiment of the present invention, a semiconductor apparatus is provided with a connection terminal that is different from the connection terminal of the first embodiment. In the third embodiment, like components are denoted with like reference numerals as of the reference numerals of the first embodiment and are not further explained.

Figure 11:
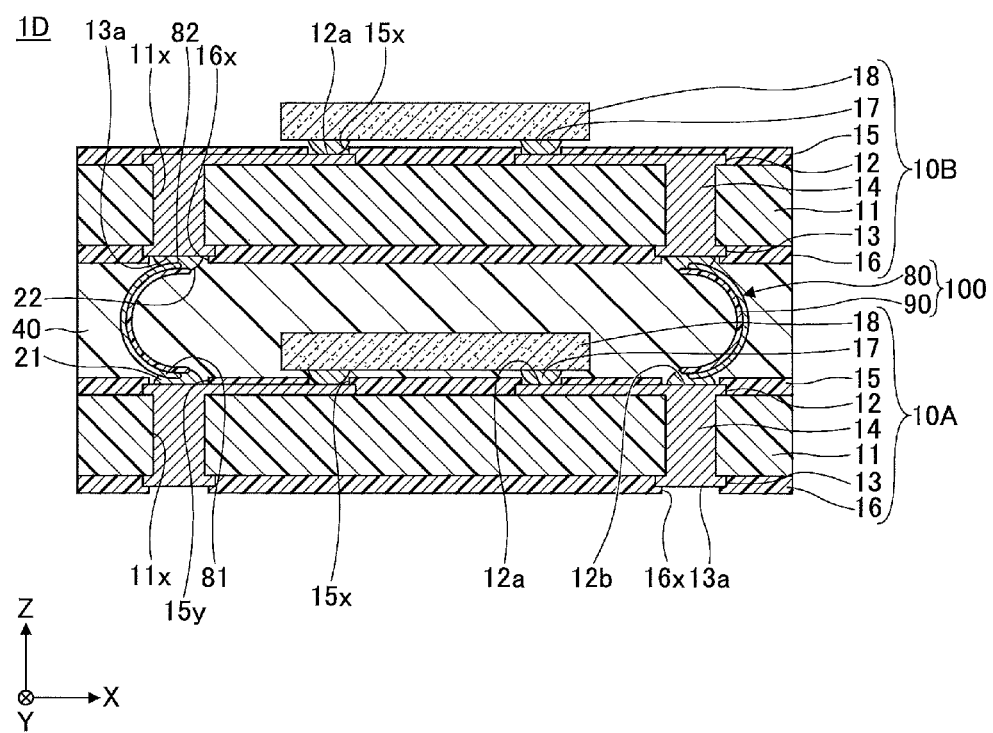
FIG. 11 is a cross-sectional view illustrating an example of a semiconductor apparatus according to a third embodiment of the present invention.
Figure 12A:
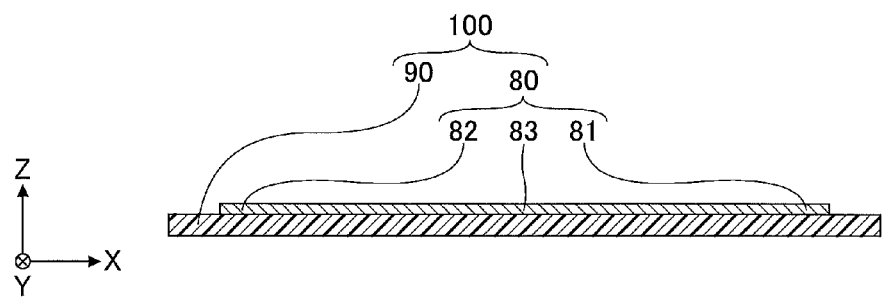
FIGS. 12A and 12B are schematic diagrams for describing connection terminals of the third embodiment.
Figure 12B:
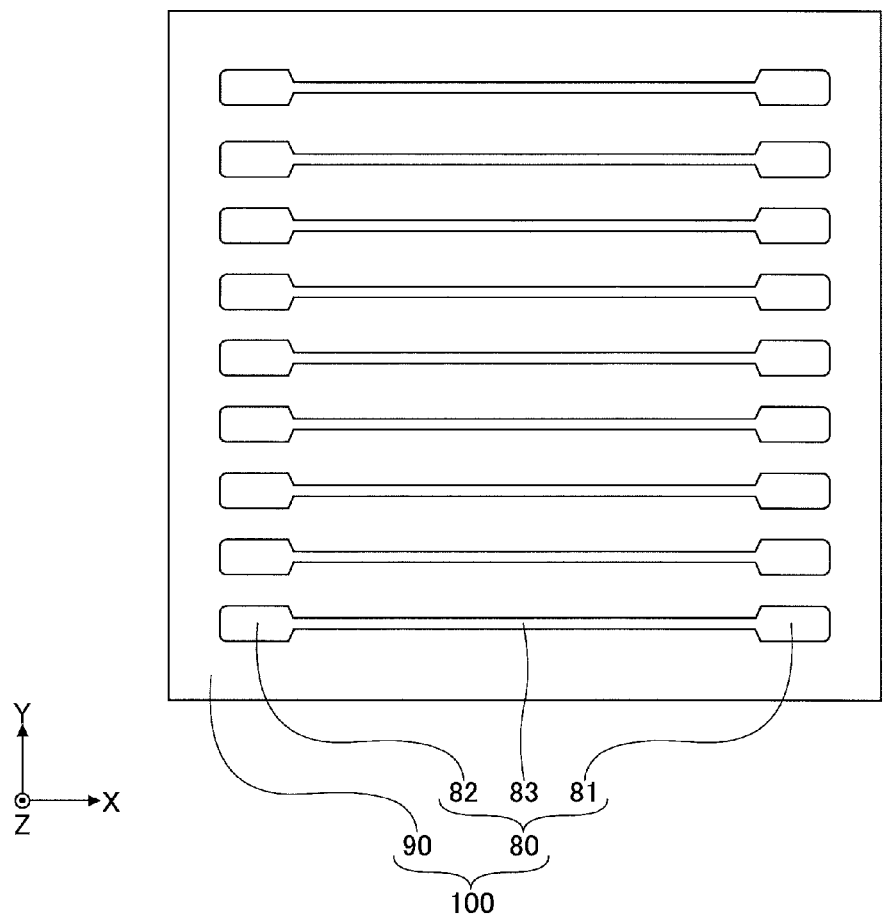

FIG. 11 is a cross-sectional view illustrating a semiconductor apparatus 1D according to the third embodiment of the present invention. FIGS. 12A and 12B are schematic diagrams for describing a connection terminal of the third embodiment. FIG. 12A is a cross-sectional view illustrating the connection terminal of the third embodiment. FIG. 12B is a plan view illustrating the connection terminal of the third embodiment. It is to be noted that FIGS. 12A and 12B illustrate the shape of the connection terminal before being bent as illustrated in FIG. 11.

With reference to FIGS. 11, 12A, and 12B, the semiconductor apparatus 1D of the third embodiment is different from the semiconductor apparatus 1 of the first embodiment (see FIGS. 1A and 1B) in that the multiple connection terminals 30 are replaced with multiple connection terminals 80.

Each of the multiple connection terminals 80 is arranged on an insulating film 90. The connection terminal 80 and the insulating film 90 constitute a flexible substrate 100 having a flexible property. The connection terminal 80 includes a first pad 81, a second pad 82, and a wiring pattern 83 that connects the first and second pads 81, 82. The first pad 81, the second pad 82, and the wiring pattern 83 may be integrally formed.

As illustrated in FIG. 12B, the multiple connection terminals 80 are arranged substantially parallel to each other at substantially equal intervals on the insulating film 90. That is, the shape of each of the multiple connection terminals 80 is a substantially rectangular shape (thin-elongated shape) from a plan view. The connection terminals 80 are adjacently arranged, so that longitudinal sides of the connection terminals 80 face each other. The connection terminals 80 are adjacently arranged, so that intervals between the side surfaces of the connection terminals 80 facing each other are constant from a plan view. Thereby, similar to the connection terminals 30 of the first embodiment, the connection terminals 80 (wiring pattern 83) can form a coplanar structure.

The pitch of the connection terminals 80 (pitch of the wiring patterns 83) may be, for example, approximately 0.4 mm to 1.5 mm. It is to be noted that a solder resist layer that covers the wiring pattern 83 of the connection terminal 80 may also be provided. In this case, only the first and second pads 81, 82 of the connection terminal 80 are exposed from the solder resist layer.

The flexible substrate 100 is provided between the wiring substrate 10A and the wiring substrate 10B in a state where the multiple connection terminals 80 are arranged on the insulating film 90 in which each of the multiple connection terminals 80 is bent into a substantially C-letter shape. In this state, the insulating film 90 is provided on an inner side of the flexible substrate 100. Then, the first pad 81 of the connection terminal 80 is bonded to the pad 12b of the wiring substrate 10A by way of the bonding part 21. Further, the second pad 82 of the connection terminal 80 is bonded to the pad 13a of the wiring substrate 10B by way of the bonding part 22. Thereby, the first pad 81 of the connection terminal 80 corresponds to the fixing part 31 of the connection terminal 30, and the second pad 82 of the connection terminal 80 corresponds to the fixing part 32 of the connection terminal 30.

For example, a metal foil such as copper foil may be used as the connection terminal 80 of the flexible substrate 100. The thickness of the connection terminal 80 may be, for example, approximately 18 μm to 35 μm. For example, a metal plating may be applied to the first and second pads 81, 82 of the connection terminal 80, or to the entire connection terminal 80. For example, an insulating resin (e.g., polyimide type resin, epoxy type resin, polyester type resin) may be used to form the insulating film 90. The thickness of the insulating film 90 may be, for example, approximately 50 μm to 125 μm.

In order to manufacture the flexible substrate 100, the insulating film 90, which is formed of, for example, the above-described insulating resin, is to be prepared. Then, a metal foil such as copper foil is adhered to the insulating film. Then, the connection terminals 80 are formed by using, for example, a subtractive method to pattern the metal foil. According to necessity, a solder resist layer may be selectively formed on the connection terminals 80. Thereby, manufacturing of the flexible substrate 10C having a flexible property is completed.

Hence, with the third embodiment, the flexible substrate 100 having multiply arranged connection terminals 80 may be provided instead of the multiple connection terminals 30 formed of metal. Similar to the first embodiment, multiple connection terminals 80 (wiring patterns 83), which have substantially rectangular shapes from a plan view, are arranged, so that the longitudinal sides of the rectangular shapes of the connection terminals 30 face the same direction. Further, among the multiple connection terminals 80 (wiring patterns 83), one connection terminal 80 (wiring pattern 83) is assigned as a signal terminal S and two other connection terminals 80 (wiring pattern 83) are assigned as ground terminals G provided on both sides of the one connection terminal 80 (wiring pattern 83) assigned as the signal terminal S. Therefore, the third embodiment can also attain the same effects pertaining to high frequency as those of the first embodiment. Further, in a case where a material having a flexible property is used as the resin part 40, the thermal stress caused by the difference of thermal expansion coefficients between the wiring substrates 10A, 10B can be absorbed because the resin part 40 allows the plastic deformation of the flexible substrate 100 having a flexible property (including the connection terminals 80 and insulating film 90). As a result, connection reliability between the wiring substrate 10A and the wiring substrate 10B can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, although connection terminals are arranged along an entire periphery of an electronic component (area corresponding to all four sides of the electronic component) according to the above-described embodiments, the connection terminals may be arranged along a portion of the periphery of the electronic component (e.g., area corresponding to two sides of the electronic component).

Further, although the connection terminal according to the above-described embodiments includes a curved part, the curved part may be replaced with, for example, an acute bent part, so that the connection terminal has a chevron-like shape.

Further, in the above-described embodiments, the fixing parts on both ends of the connection terminal are bonded to corresponding pads with, for example, solder. Alternatively, one of the fixing parts may be bonded to a corresponding pad with solder whereas the other of the fixing parts may abut another corresponding pad without being fixed with solder or the like. However, in this case, a separate member is required for positioning and retaining the vertically adjacent wiring substrates having the connection terminal therebetween (e.g., frame-like member).

Further, the above-described embodiments and modified examples may be combined. For example, the first modified example (i.e. providing no resin between a space between the vertically adjacent wiring substrates interposed by the connection terminals, so that the space is hollow) may be combined with the second or third embodiment.

What is claimed is:

1. A semiconductor apparatus comprising:
   a first wiring substrate;
   a second wiring substrate positioned above the first wiring substrate;
   a plurality of connection terminals provided between the first wiring substrate and the second wiring substrate and configured to electrically connect the first wiring substrate and the second wiring substrate; and
   an electronic component provided on the first wiring substrate and the second wiring substrate;
   wherein the plurality of connection terminals include a signal terminal and ground terminals provided on both sides of the signal terminal,
   wherein the signal terminal and the ground terminals have side surfaces that face each other,
   wherein the signal terminal and the ground terminals are adjacently arranged, so that intervals between the side surfaces of the signal terminal and the ground terminals are constant from a plan view,
   wherein the plurality of connection terminals have a resilient property.

2. The semiconductor apparatus as claimed in claim 1,
   wherein the signal terminal and the ground terminals have a rectangular shape from the plan view,
   wherein the side surface of each of the signal terminal and the ground terminals is a longitudinal side of the rectangular shape,
   wherein the signal terminal and the ground terminals are adjacently arranged, so that the longitudinal sides of the signal terminal and the ground terminal face each other.

3. The semiconductor apparatus as claimed in claim 1,
   wherein the first wiring substrate includes a pad and a through-wiring provided immediately below the pad,
   wherein the plurality of connection terminals include an end part that is bonded to the pad.

4. The semiconductor apparatus as claimed in claim 1,
   wherein the second wiring substrate includes a pad and a through-wiring provided immediately above the pad,
   wherein the plurality of connection terminals include an end part that is bonded to the pad.

5. The semiconductor apparatus as claimed in claim 1, wherein the first and second wiring substrates have thermal expansion coefficients different from each other.

6. The semiconductor apparatus as claimed in claim 1,
   wherein the plurality of connection terminals include at least one connection terminal that includes
   a curved part having a resilient property,
   a first fixing part provided on one end of the one connection terminal, and
   a second fixing part provided on another end of the one connection terminal,
   wherein the first wiring substrate includes a pad, wherein the second wiring substrate includes a pad, wherein the first fixing part is bonded to the pad of the first wiring substrate by way of a first bonding part, wherein the second fixing part is bonded to the pad of the second wiring substrate by way of a second bonding part.

7. The semiconductor apparatus as claimed in claim 1, wherein the electronic component is directly connected to, via a bonding part, the at least one of the first wiring substrate and the second wiring substrate.

8. A semiconductor apparatus comprising:

a first wiring substrate;

a second wiring substrate positioned above the first wiring substrate;

a plurality of connection terminals provided between the first wiring substrate and the second wiring substrate and configured to electrically connect the first wiring substrate and the second wiring substrate;

an electronic component directly provided on at least one of the first wiring substrate and the second wiring substrate; and a resin part provided between the first and second wiring substrates and configured to encapsulate the plurality of connection terminals, wherein the resin part is formed of a material that allows plastic deformation of the plurality of connection terminals, wherein the plurality of connection terminals include a signal terminal and ground terminals provided on both sides of the signal terminal, wherein the signal terminal and the ground terminals have side surfaces that face each other, wherein the signal terminal and the ground terminals are adjacently arranged, so that intervals between the side surfaces of the signal terminal and the ground terminals are constant from a plan view.

9. The semiconductor apparatus as claimed in claim 8, wherein the material includes elastomer.

10. A semiconductor apparatus comprising:

a fist wiring substrate;

a second wiring substrate positioned above the first wiring substrate;

a plurality of connection terminals provided between the first wiring substrate and the second wiring substrate and configured to electrically connect the first wiring substrate and the second wiring substrate;

an electronic component directly provided on at least one of the first wiring substrate and the second wiring substrate;

a power generating device that generates electric energy; and a secondary battery that stores the electric energy generated by the power generating device;

wherein the electronic component is configured to operate by the electric energy stored by the secondary battery, wherein the plurality of connection terminals include a signal terminal and ground terminals provided on both sides of the signal terminal, wherein the signal terminal and the ground terminals have side surfaces that face each other, wherein the signal terminal and the ground terminals are adjacently arranged, so that intervals between the side surfaces of the signal terminal and the ground terminals are constant from a plan view.

\* \* \* \* \*